United States Patent [19]
Dikeman et al.

[11] Patent Number: 5,932,898
[45] Date of Patent: Aug. 3, 1999

[54] INTEGRATED INDUCTIVE LOAD SNUBBING DEVICE

[75] Inventors: John Mark Dikeman; Mark Wendell Gose, both of Kokomo, Ind.

[73] Assignee: Delco Electronics Corporation, Kokomo, Ind.

[21] Appl. No.: 08/871,804

[22] Filed: Jun. 9, 1997

Related U.S. Application Data

[62] Division of application No. 08/617,705, Apr. 1, 1996, Pat. No. 5,703,520.

[51] Int. Cl.⁶ .......................... H01L 29/74; H01L 23/62; H01L 29/00
[52] U.S. Cl. .......................... 257/173; 257/355; 257/531
[58] Field of Search .................... 257/173, 174, 257/355, 356, 357, 359, 360, 531

[56] References Cited

U.S. PATENT DOCUMENTS

| | | | |
|---|---|---|---|
| 3,725,683 | 4/1973 | Andersen | 327/439 |
| 3,878,551 | 4/1975 | Callahan, Jr. | 257/547 |
| 3,932,769 | 1/1976 | Pollmeier | 327/439 |
| 4,015,143 | 3/1977 | Tokunaga et al. | 327/439 |
| 4,153,909 | 5/1979 | Dobkin | 257/562 |
| 4,432,032 | 2/1984 | Baker et al. | 327/471 |
| 4,774,420 | 9/1988 | Sutton | 327/111 |
| 5,081,514 | 1/1992 | Ueoka | 257/355 |
| 5,406,105 | 4/1995 | Lee | 257/355 |
| 5,606,278 | 2/1997 | Palara | 327/428 |

FOREIGN PATENT DOCUMENTS 41 12 084 A1  10/1991  Germany .............................. 327/428

*Primary Examiner*—Wael M. Fahmy
*Attorney, Agent, or Firm*—Jimmy L. Funke

[57] ABSTRACT

A transient suppressor comprises a self-triggered silicon control rectifier (SCR) that forms a drive circuit for an NPN power transistor. The SCR and the NPN power transistor are combined, along with other elements, into an integrated circuit (IC) by a junction isolated BiCMOS process. The SCR self-triggers upon being subjected to an inductive flyback condition created by an inductive load and renders the NPN transistor conductive, thereby allowing the NPN power transistor, having a relatively large semiconductor region, to effectively snub the current created by the negative feedback condition. The transient suppressor may be used in either a high-side or low-side driver arrangement and the SCR/NPN power transistor combination may further be combined with load driving and other circuitry on a single integrated circuit. The IC is designed to perform normally when subjected to transient conditions and further when there exists a potential voltage differential between the circuit ground and the load ground of at least 2 volts.

10 Claims, 3 Drawing Sheets

INTEGRATED INDUCTIVE LOAD SNUBBING DEVICE

This is a division of application Ser. No. 08/617,705 filed on Apr. 1, 1996, now U.S. Pat. No. 5,703,520.

FIELD OF THE INVENTION

The present invention relates generally to circuitry for snubbing inductive flyback, and more specifically to a solid state transient suppressor including a silicon controlled rectifier (SCR) and an NPN power transistor that are combined into a single integrated circuit (IC) such that the SCR forms drive circuitry for the NPN power transistor to thereby permit consistent circuit performance in spite of being subjected to flyback conditions created by an inductive load.

BACKGROUND OF THE INVENTION

Power transistors having high power handling capabilities are commonly employed as drive devices to supply relatively high levels of current to inductive loads. Examples of such inductive loads commonly encountered in the automotive industry include ignition coils and fuel injectors. In a so-called high-side driver arrangement, a power transistor is typically connected in series with the inductive load and upon the application of an excitation signal to the power transistor, a load current begins to flow through the inductive load and power transistor in a rapidly increasing manner. Upon removal of the excitation signal, a relatively high voltage is initially present at the connection between the power transistor and inductive load as the typically large load current flowing through the load begins to decay in accordance with the inductive properties of the load. Such a condition is often referred to as inductive flyback.

Unless otherwise provided for by a transient suppressor device, sometimes referred to as a snubber circuit, the high voltage present at the power transistor/inductive load interface may exceed the breakdown voltages of the various power transistor junctions. The combination of junction breakdown and resultant high load current flowing through the power transistor may result in a condition known as "latch-up", wherein a current path is established from the load to the substrate of the power transistor (ground potential). The resulting uncontrolled conduction of load current into the power transistor substrate may ultimately result in destruction of the power transistor.

Various techniques are known to restrain or suppress the detrimental action of the inductive flyback condition and some of these techniques may be described with reference to FIG. 1 herein. These techniques may employ a conventional power transistor driver 10, arranged as a high-side driver, in cooperation with flyback detection circuitry 12. The power driver 10 operates in a typical manner to supply load current from $V_{SUPPLY}$ to the inductive load L1 in response to an excitation signal, and after the excitation signal is removed from the power driver 10, the flyback detection circuit 12 operates in a typical manner to detect the inductive flyback condition and provide the necessary gating signals to render the power driver 10 conductive so as to return to its controlled "on" state. However, the cooperative action between the power driver 10 and flyback detection circuit 12 causes a relatively high level of power to be dissipated by the power driver 10 which may be expressed by the following relationship (1):

$$\text{Power} = \text{ILOAD} (V_{SUPPLY} - (-\text{VLOAD}))$$

The power dissipated can be quite high since it is a function of the supply voltage $V_{SUPPLY}$, as well as the load current ILOAD. Furthermore, the power dissipated could also be subjected to supply transients since the power driver 10 is connected directly to $V_{SUPPLY}$. The power dissipated for transient suppression purposes can be lowered if a transient suppressor device 14 is used that would clamp or fix the operation of the additional device 14 at a definite level, such as a ground potential, and such lowered power dissipation may be expressed by the following relationship (2):

$$\text{POWER} = \text{ILOAD} (0 - (-\text{VLOAD}))$$

The additional clamping device 14 should be comparable in size (current carrying capability) to the power driver 10 in order to handle the load current to which it is subjected. Such an additional device 14 may be in a form of a power diode, an auxiliary power transistor, or a self-triggered silicon controlled rectifier (SCR). The power diode option could provide the clamping function, but it would require a diode that has a relatively large silicon area so as to have the necessary high current carrying capability. The auxiliary power transistor option would improve the ability to provide for the needed silicon area, but the improvement in area would be lost by the need for additional drive circuitry for the auxiliary power transistor that operates in a manner similar to the flyback detection circuitry 12. The self-triggered SCR option would have the desired current carrying capabilities and not need additional drive circuitry, but it is difficult to implement a SCR with the type of fabrication processes used to provide analog, digital, and power circuits on a single integrated circuit.

All three (power diode, auxiliary power transistor, and SCR) of these configurations have an additional drawback possibility, that being the creation of a known parasitic diode in which the parasitic diode becomes forward biased under reverse $V_{SUPPLY}$ conditions and thereby injects supply current into the power driver 10. Furthermore, the power diode and auxiliary power transistor configurations may continuously allow current to be fed from the circuit ground back into the inductive load if a two-volt (2V) potential differential exists between the circuit ground of the integrated circuit and the load ground, as is common practice in applications involving inductive loads. For example, in many automotive applications, as much as a 2-volt potential difference may exist between circuit ground of any given "system" and chassis ground.

What is therefore needed is a combination flyback detection and transient suppressor device that provides an area efficient and low power means of snubbing inductive flyback without the risk of latch-up and without drawing current from the substrate of such a device. Ideally, such a device should be formed of a single integrated circuit and be capable of consistent operation when subjected to at least a 2V potential differential between circuit ground and load ground.

SUMMARY OF THE INVENTION

The foregoing shortcomings of the prior art are addressed by the present invention. In accordance with one aspect of the present invention, an inductive load snubbing device comprises a PNP transistor having an emitter defining a first terminal of the device, a base, and a collector, and an NPN transistor having an emitter defining a second terminal of the device, a base connected to the collector of the PNP transistor, a first collector connected to the base of the PNP transistor and a second collector connected to the emitter of the PNP transistor. The second collector, base and emitter of the NPN transistor form a power transistor, and the emitter, base and collector of the PNP transistor, and the emitter of the NPN transistor form an SCR for driving the power transistor.

In accordance with another aspect of the present invention, an integrated circuit defining an inductive load snubbing device comprises a first region of N-type semiconductor material, a second region of P-type semiconductor material arranged within the first region and forming a PN junction there between, a number of third regions of N-type semiconductor material arranged within the second region, wherein each of the third regions form an independent PN junction with the second region, and a fourth region of P-type semiconductor material arranged within one of the third regions and forming a PN junction therebetween.

In accordance with a further aspect of the present invention, a power driver responsive to a load activation signal to permit current to flow through the power driver and through an inductive load connected thereto is combined with an inductive load snubbing device for providing transient protection of the power driver. The inductive load snubbing device comprises a silicon controlled rectifier (SCR) having first, second, third and fourth regions of alternating semiconductor material defining PN junctions therebetween with the first region being of a P-type conductivity, wherein the first region defines an anode of the SCR and the fourth region defines a cathode of the SCR, and wherein the anode is electrically connected to the a circuit ground reference and the cathode is electrically connected to a node defined by a connection of the power driver to the inductive load. The device further includes an NPN power transistor having an emitter, base and collector, wherein the fourth region of the SCR defines the emitter, the third region of the SCR defines the base, and the collector is defined by a fifth region of semiconductor material of an N-type conductivity which surrounds the third region of the SCR and defines a PN junction therebetween, and wherein fifth region is electrically connected to the anode of the SCR.

In accordance with yet a further aspect of the present invention, a power driver responsive to a load activation signal to permit current to flow through the power driver and through an inductive load connected thereto is combined with an inductive load snubbing device for providing transient protection of the power driver. The inductive load snubbing device comprises a silicon controlled rectifier (SCR) having first, second, third and fourth regions of alternating semiconductor material defining PN junctions therebetween with the first region being of a P-type conductivity, wherein the first region defines an anode of the SCR and the fourth region defines a cathode of the SCR. The anode is electrically connected to a first end of the inductive load and the cathode is connected to a second opposite end of the inductive load, wherein load current flows from the first end toward the second end of the inductive load. The device further includes an NPN power transistor having an emitter, base and collector, wherein the fourth region of the SCR defines the emitter, the third region of the SCR defines the base, and the collector is defined by a fifth region of semiconductor material of an N-type conductivity which surrounds the third region of the SCR and defines a PN junction therebetween, and wherein fifth region is electrically connected to the anode of the SCR.

One object of the present invention is to provide a solid state device that not only suppresses the detrimental effects of an inductive flyback condition created by an inductive load, but does so with low power dissipation.

Another object of the present invention is to provide a solid state device for suppressing the effects of an inductive flyback condition of an inductive load, yet allow for at least a two-volt potential differential between the circuit ground of the device and the load ground without allowing current to flow from the circuit ground of the device to the load ground or vice versa.

A further object of the present invention is to provide for a solid state transient suppressor device that is part of an integrated circuit that includes a power transistor for driving an inductive load, wherein the transient suppressor is operable to snub an inductive flyback condition associated with the operation of the inductive load.

These and other objects of the present invention will become more apparent from the following description of the preferred embodiment.

DESCRIPTION OF THE PREFERRED EMBODIMENT

Figure 1:
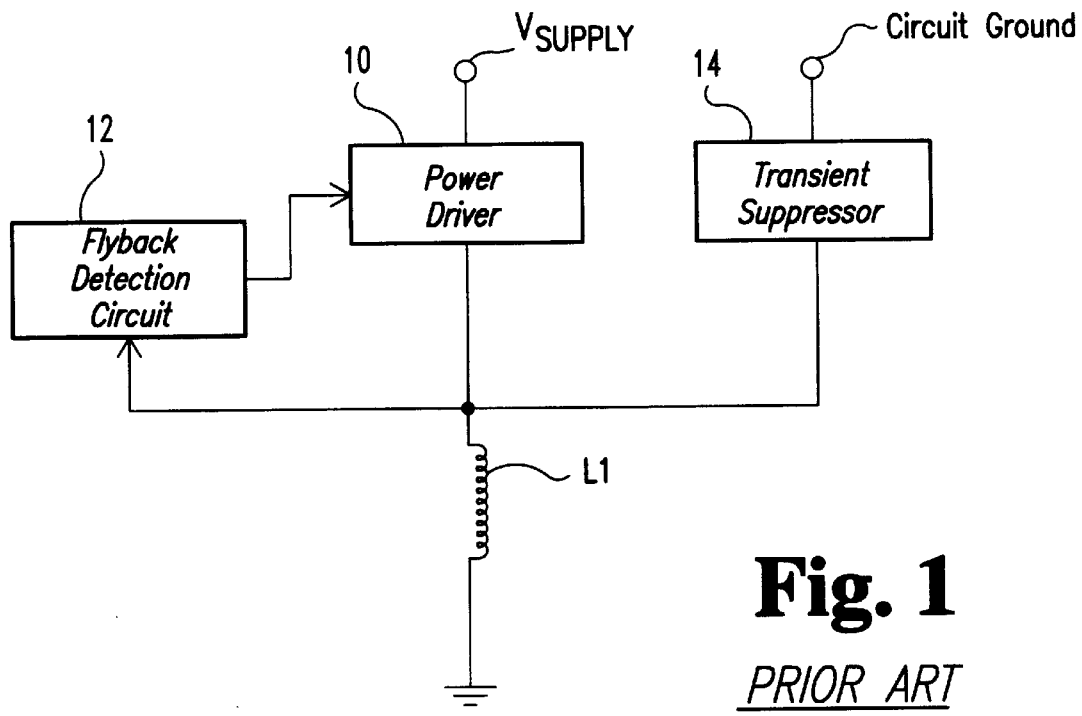
FIG. 1 is a diagrammatic illustration of various prior art techniques for suppressing undesirable affects of an inductive flyback condition.

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

The present invention is illustrated in FIGS. 2–5 and provides a solid state transient suppressor that restrains and suppresses the detrimental effects related to the inductive flyback condition, discussed previously, associated with the operation of an inductive load. In general, the invention comprises a self-triggerable silicon controlled rectifier (SCR) that forms the drive circuit for a NPN power transistor. The SCR and NPN power transistor are combined, along with other circuit elements, into an integrated circuit, preferably in accordance with a known junction isolated BiCMOS process.

Figure 2:
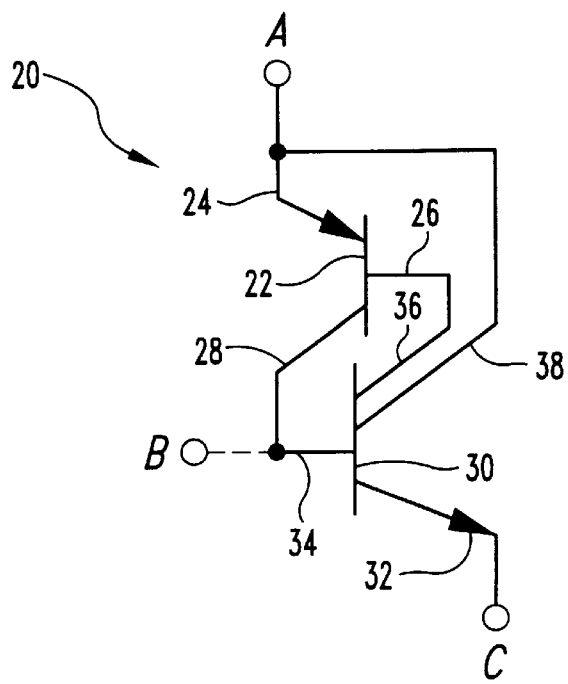
FIG. 2 is a schematic diagram of an inductive load snubbing device in accordance with the present invention.

Referring now to FIG. 2, a two (2) transistor model of a solid state transient suppressor 20, in accordance with the present invention, is shown. A PNP transistor 22 includes an emitter 24, a base 26, and a collector 28. A second transistor, NPN transistor 30, includes an emitter 32, a base 34, a first collector 36, and a second collector 38. The collector 28 of PNP transistor 22 is connected to the base 34 of NPN transistor 30. The base 26 of PNP transistor 22 is connected to the first collector 36 of NPN transistor 30. Finally, the emitter 24 of PNP transistor 22 is connected to the second collector 38 of NPN transistor 30.

The emitter 24 and second collector 38 connection defines an input terminal A, and the emitter 32 defines an output terminal C, of device 20. Optionally, a third terminal B may be provided at the connection of collector 28 and base 34.

The SCR portion of solid state transient suppressor 20 comprises a PNPN device defined by emitter 24, base 26/collector 36, collector 28/base 34, and emitter 32. Terminal A of device 20 defines the anode of the SCR, and the terminal C defines the cathode of the SCR. Optional terminal B defines a gate of the SCR. As will be discussed in greater detail hereinafter, a resistance may be established between terminals A and B to render the SCR self-triggering as is known in the art. The NPN power transistor portion of solid state transient suppressor 20 comprises an NPN transistor defined by collector 38, base 34, and emitter 32. In operation, the base 34 of the NPN power transistor is driven by the self-triggering SCR, under conditions to be described hereinafter, to provide current flow from collector 38 to emitter 32.

Figure 3:
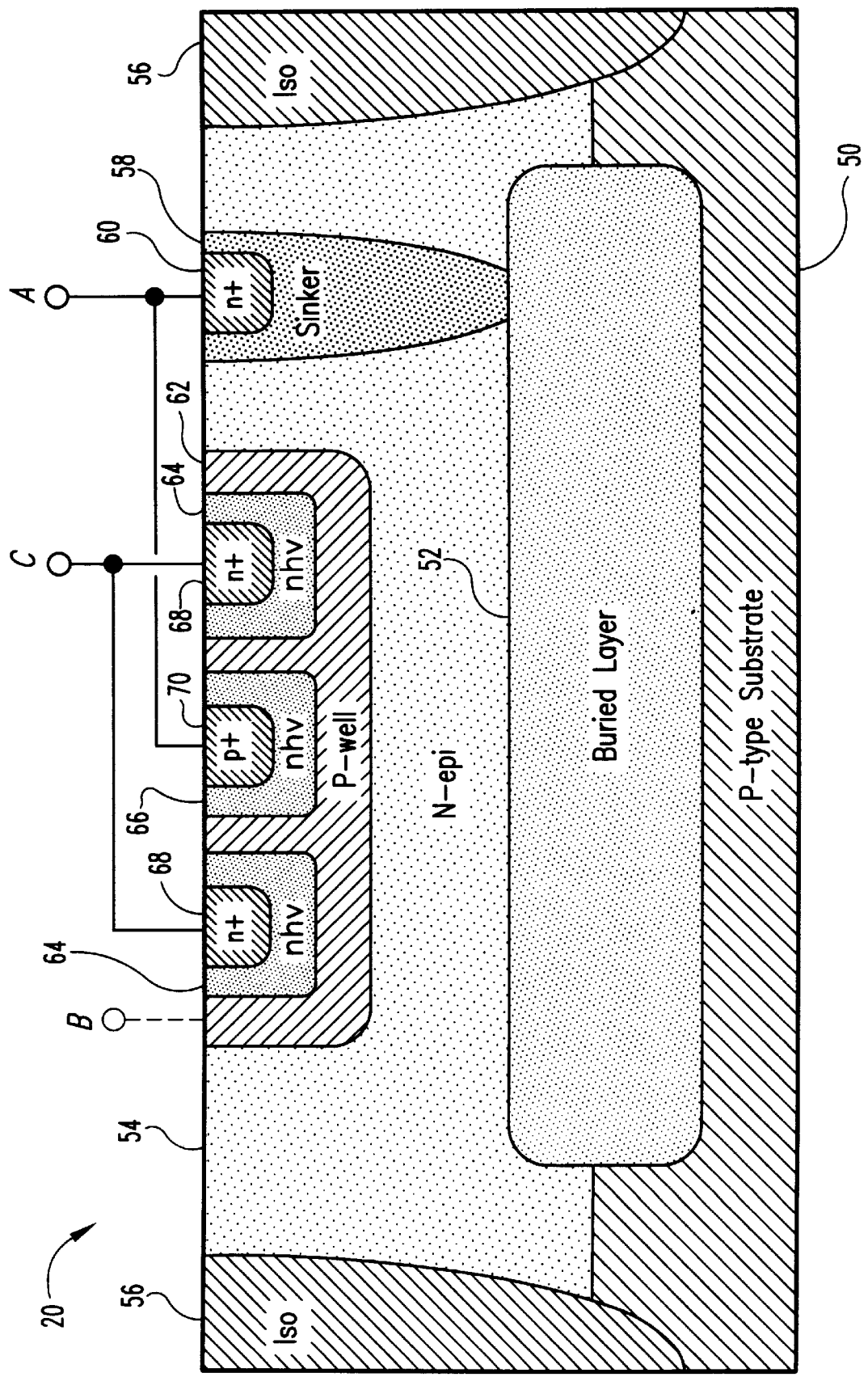
FIG. 3 is a cross sectional view of one embodiment of the inductive load snubbing device of FIG. 2 in the form of an integrated circuit.

Referring now to FIG. 3, a preferred embodiment of solid state transient suppressor 20 is shown as implemented in the form of an integrated circuit. Preferably, solid state transient suppressor 20 is fabricated in accordance with a junction isolated BiCMOS process, although the present invention contemplates utilizing any such process that allows analog, digital, and power circuits to be fabricated on a single integrated circuit. Furthermore, those skilled in the art will recognize that the embodiment shown in FIG. 3 represents one way of implementing solid state transient suppressor 20 in silicon, and that modifications and variations thereof may be made without detracting from the underlying concepts of device 20 described herein. It is intended that all such modifications and variations fall within the scope of the present invention.

The solid state transient suppressor 20 shown in FIG. 3 includes various regions, or layers, of semiconductor material which will be referred to hereinafter by their conventional abbreviations. A list of such abbreviations, and a general description thereof, is given in Table 1.

TABLE 1

Semiconductor Process Terminology

| ABBREVIATION | GENERAL DEFINITION |
|---|---|
| n+ | N-type semiconductor material having a high dopant concentration |
| p+ | P-type semiconductor material having a high dopant concentration |
| nhv | N-type high voltage semiconductor material |
| P-well | P-type semiconductor material formed into a well configuration |
| P-type substrate | P-type semiconductor material comprising the substrate of the integrated circuit (IC) |
| N-epi | a lightly doped N-type epitaxial layer of semiconductor material formed on the P-type substrate |
| Buried Layer | heavily doped N-type semiconductor material formed at the N-epi and P-type substrate interface |
| Sinker | heavily doped N-type semiconductor material extending throught the N-epi layer and into the Buried Layer |

TABLE 1-continued

Semiconductor Process Terminology

| ABBREVIATION | GENERAL DEFINITION |
|---|---|
| ISO | p-type semiconductor material extending through the N-epi layer to the P-type substrate to form junction isolated N-epi regions |

Referring to Table 1, each of the semiconductor regions described therein may be fabricated in accordance with various semiconductor processing techniques. Typically, however, the P-well, Buried Layer, Sinker, and ISO regions are thermally diffused into the underlying semiconductor region. The n+, p+ and nhv regions, on the other hand, are typically implanted into the underlying semiconductor region. Finally, the N-epi layer is typically grown onto a bulk P-type substrate after selectively diffusing Buried Layer regions therein. Those skilled in the art will recognize that the foregoing semiconductor processing techniques represent typical fabrication methods, and that alternative fabrication techniques may be substituted therefore without detracting from the scope of the present invention.

Referring now to the particulars of FIG. 3, fabrication of the solid state transient suppressor 20 in the form of an integrated circuit begins with providing a bulk P-type substrate 50 upon which a Buried Layer 52 is formed. Thereafter, an N-epitaxial layer 54 is formed (typically grown) over the entire P-type substrate 50. P-type isolation regions 56 are then selectively formed, and extended into P-type substrate 50, to isolate the N-epi region 54 from other devices contained on the integrated circuit. Topologically, the isolation region 56 typically circumscribes the N-epi region 54, to thereby form an isolated N-epi pocket 54. N-type Sinker 58 is then formed within N-epi pocket 54, and extends into Buried Layer 52. An n+ region 60 is formed within Sinker 58 to provide an ohmic contact thereto.

Within N-epi pocket 54, and apart from Sinker 58, a P-well 62 is formed. Within P-well 62, a number of nhv regions 64 and 66 are formed. Within the number of nhv regions 64, n+ regions 68 are formed to provide an ohmic contact thereto. Finally, within nhv region 66, a p+ region is formed. The n+ region 60 and p+ region 70 are connected together, typically with integrated circuit metalization (not shown), to form terminal A of the device 20. Similarly, the number of n+ regions 68 are connected together, typically with integrated circuit metalization, to form terminal C of device 20. Optionally, P-well 64 may be contacted, typically with integrated circuit metalization, to provide terminal B of device 20. Each of the foregoing semiconductor regions forms a corresponding semiconductor junction with the underlying semiconductor region as is well known in the art.

The SCR portion of solid state transient suppressor 20 is formed by a vertical PNP transistor, defined by p+ region 70, nhv region 66, and P-well 62, which then feeds a lateral NPN transistor, defined by nhv region 66, P-well 62, and the number of nhv regions 64. The vertical PNP transistor corresponds to transistor 22 of FIG. 2, wherein p+ region 70 corresponds to emitter 24, nhv region 66 corresponds to base 26, and P-well 62 corresponds to collector 28. Similarly, the lateral NPN transistor corresponds to a portion of transistor 30 of FIG. 2, wherein nhv region 66 corresponds to first collector 36, P-well 62 corresponds to base 34, and the number of nhv regions 64 correspond to emitter 32. Thus, the well-known PNPN SCR structure is formed by the combination of p+ region 70, nhv region 66, P-well 62, and the number of nhv regions 64, respectively.

The power transistor portion of solid state transient suppressor 20 is formed as a vertical NPN transistor in parallel with the lateral NPN transistor just described, to create a high current power path therethrough. Specifically, the vertical NPN transistor corresponds to the remaining portion of transistor 30 of FIG. 2, wherein N-epi pocket 54 generally corresponds to collector 38, P-well 62 corresponds to base 34, and the number of nhv regions 64 correspond to the emitter 32. The Sinker 58 and Buried Layer 52 are formed within device 20 to provide a low-resistance path from the N-epi pocket 54 to the terminal A. Since the vertical NPN transistor just described is intended as a high power device, those skilled in the art will recognize that it is desirable to minimize the collector-emitter saturation voltage of such a device ($V_{CE,SAT}$). This feature is effectuated through the use of low resistance Sinker 58 and Buried Layer 52 regions.

Preferably, nhv 64 and n+ 68 regions form a single strip of semiconductor material surrounding nhv region 66, to thereby form a concentric collector 36 of NPN transistor 30 (FIG. 2). However, those skilled in the art will recognize that nhv 64 and n+ 68 regions need not surround nhv region 66, and that any number of nhv regions 64 (and corresponding n+ regions 68) may be patterned within P-well 62 and then connected together to form terminal C of device 20. It is to be understood that any such deviations from the structure shown in FIG. 3 are intended to fall within the scope of the present invention.

The SCR portion of solid state transient suppressor 20 (p+ region 70, nhv region 66, P-well 62, and nhv regions 64) is preferably self-triggering which may be accomplished by providing a resistance value between terminals A and B as is known in the art. To this end, an external resistor may be provided and connected as previously described to render the SCR self-triggering. Alternatively, the dopant concentration of the various semiconductor regions defining the SCR may be selected to have particular values so that the SCR may be rendered self-triggering device without the need for any external resistor.

Preferably, the solid state transient suppressor 20 is fabricated in accordance with a known BiCMOS process. In so doing, it should be noted that unlike prior art devices, the power driver 10 (FIG. 1), which is typically a MOS power transistor, may be combined with the transient suppressor 20 onto a single integrated circuit having the capability of having additional analog, digital, and power circuits included therein, all of which share a common substrate and circuit ground reference. It should be noted, however, that the present invention contemplates utilizing other known semiconductor fabrication processes in providing solid state transient suppressor 20, such as any known bipolar junction process. In fact, such a bipolar junction fabrication process may be preferable in cases where the power driver 10 is provided as a power bipolar junction transistor (BJT).

Referring to FIGS. 2 and 3, the operation of solid state transient suppressor 20 will now be described. In accordance with known SCR operation, the SCR self-triggers and provides drive current to the base of NPN transistor 30, when the voltage at terminal C drops sufficiently below the voltage at terminal A. The value of resistance established between terminals A and B determines the voltage differential between terminals A and C which causes the SCR to self-trigger. As the voltage differential between terminals A and C increases, the SCR correspondingly increases the base drive to the vertical NPN transistor defined by collector 38,
base 34, and emitter 32. If terminal A is referenced at ground potential, the power dissipated by solid state transient suppressor 20 is kept to a minimum since $V_{LOAD}=V_{CE,SAT}$ of the vertical NPN transistor in equation 2 above. As previously discussed, $V_{CE,SAT}$ is minimized through the use of Sinker 58 and Buried Layer 52 regions. As the voltage at terminal C increases sufficiently toward the voltage at terminal A, the SCR turns off, thereby deactivating the snubbing action of the vertical NPN transistor.

Figure 4:
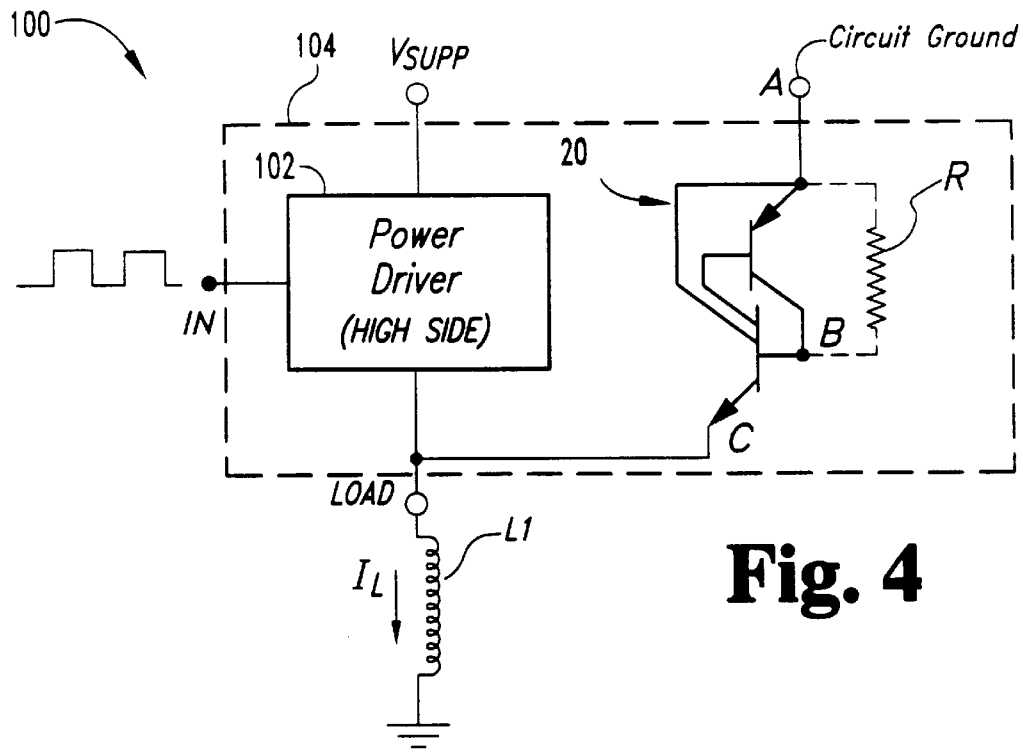
FIG. 4 is a diagrammatic illustration of a typical inductive load driving circuit configuration implementing the inductive load snubbing device of the present invention.
Figure 5:
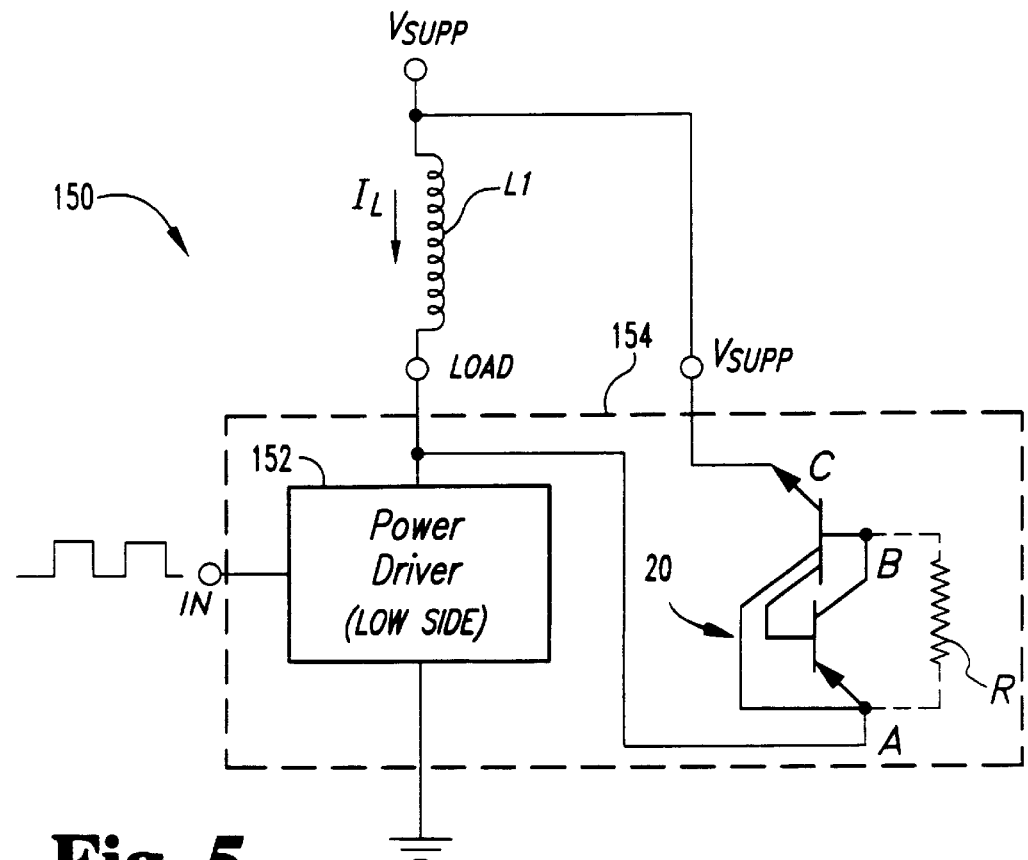
FIG. 5 is a diagrammatic illustration of another typical inductive load driving circuit configuration implementing the inductive load snubbing device of the present invention.

FIGS. 4 and 5 illustrate implementations of the foregoing solid state transient suppressor 20 in systems similar to that of the prior art of FIG. 1. Those skilled in the art will recognize that the solid state transient suppressor 20 may be sized to handle variously sized inductive loads having various supply voltage and load current requirements.

FIG. 4 illustrates a high-side driver implementation similar to that of the prior art arrangement shown in FIG. 1. Specifically, an inductive load driving arrangement 100 is shown utilizing a high side power driver 102 responsive to an excitation signal at input IN, to provide a load current $I_L$ from a voltage supply $V_{SUPP}$ to an inductive load L1 which is connected to a load ground reference. Solid state transient suppressor 20 is connected to a LOAD node, defined by the connection between high side power driver 102 and inductive load $L_1$, at terminal C thereof. Terminal A of solid state transient suppressor 20 is connected to a circuit ground reference. A resistor R is shown connected between terminals A and B of device 20 to render the SCR portion thereof self-triggering. As previously discussed, high side power driver 102 and solid state transient suppressor 20 may be provided on a single integrated circuit 104 having voltage supply and excitation signal inputs, a circuit ground reference, and a load output.

Referring now to FIG. 5, a so-called low-side load driver implementation 150, similar in operation to that shown in FIG. 4, is shown. Those skilled in the art will recognize that the principles of the present invention, described herein as relating to a high-side driver implementation, may be directly applied to a low-side driver arrangement with only minor modifications to circuit arrangement 100. Specifically, arrangement 150 includes a low-side power driver 152 responsive to an excitation signal at input IN, to permit a load current $I_L$ to flow from a voltage supply $V_{SUPP}$ connected to inductive load L1, through the low side power driver 152 to a load ground reference. Solid state transient suppressor 20, configured identically as in FIG. 4, is connected at terminal A thereof to a LOAD node defined by the connection of inductive load L1 to low side power driver 152. Terminal C of solid state transient suppressor 20 is connected to voltage supply $V_{SUPP}$. As with arrangement 100, low-side power driver 152 and solid state transient suppressor 20 of arrangement 150 may be provided as a single integrated circuit 154.

The operation of the load driver arrangements 100 and 150 of FIGS. 4 and 5, respectively, are similar in most respects. Specifically, the power driver 102 or 152 has gated signals applied to its input IN, to which the power driver is responsive to provide a load current $I_L$ from a voltage supply $V_{SUPP}$ through the power driver and through an inductive load L1 connected thereto. The inductive load L1 is preferably an ignition coil of an internal combustion engine ignition system, or other automotive inductive load, such as, for example, a fuel injector. Generally, the inductive load L1 creates an inductive current having a rapidly rising portion, in response to an excitation signal at input IN, and an abrupt alteration in the rate of change of the load current $I_L$ with respect to time that corresponds to the inductive flyback condition, previously discussed with reference to FIG. 1, when the excitation signal is removed. In the circuit arrangement of either FIG. 4 or FIG. 5, the voltage at terminal C of solid state transient suppressor 20 drops below the voltage at terminal A during inductive flyback, thereby causing the SCR portion of device 20 to self-trigger and provide drive current to the base of the vertical NPN transistor 30 (FIG. 2). As the voltage at terminal C becomes more negative with respect to that of terminal A, the SCR increases base drive to the vertical NPN transistor, thereby causing the vertical NPN transistor to conduct more current therethrough. As the inductive energy in load L1 eventually bleeds off, the voltage at terminal C becomes greater than or equal to the voltage at terminal A, and the SCR shuts off the snubbing NPN transistor. The vertical NPN power transistor described above with reference to FIGS. 2 and 3, has a relatively high current handling capability so as to handle the inductive flyback condition. This handling occurs without any current being drawn from the substrate of the integrated circuit (P-type substrate 50 of FIG. 3), and also without causing an latch-up of any other elements within the integrated circuit.

In automotive environments, there is concern for the load ground reference being −2V with respect to the integrated circuit ground reference. Such a ground reference differential is common in automotive applications as previously discussed. With most junction isolated circuit fabrication processes, this difference would allow current to be sourced from the integrated circuit substrate to the integrated circuit elements. In other words, with the integrated circuit inoperative and load ground at −2V, junctions that are normally reversed biased become forward biased and thereby allow current flow therethrough. Such substrate currents can lead to latch-up of the integrated circuit. In the present invention, due to the construction of the SCR portion of solid state transient suppressor 20, the isolated N-epi region 54 maintains a reverse bias with respect to the P-type substrate 50 to thereby prevent current flow from the substrate 50 to the various integrated circuit elements.

As seen in FIG. 4, and in view of the respective description thereof, the solid state transient suppressor 20 is only rendered conductive in response to the inductive flyback condition. Consequently, the transient suppressor 20 allows for a potential voltage difference between the circuit ground and load terminal to exceed at least 2 volts and not allow any current to be drawn from the circuit ground into the load terminal and, conversely, not allow any current to be drawn from the load terminal into the circuit ground.

It should be appreciated from the foregoing, that the practice of the present invention provides for a solid state transient suppressor 20 that has low power dissipation and allows for the integrated circuit containing a power load driver transistor to supply load current to an inductive load, and restrains the inductive flyback condition of the inductive load so as not to cause any adverse operating conditions of the integrated circuit containing transient suppressor 20 and to power load drive transistor such as latch-up of any of its analog, digital, or power transistor components. It should further be appreciated that the practice of the present invention provides for a solid state transient suppressor 20 that allows for the circuit ground and the inductive load ground to have a potential difference therebetween in excess of 2 volts, yet not allow any current flow therebetween. Finally, it should be appreciated that although the invention described herein has been primarily described for retaining the adverse conditions of an inductive flyback condition in the operation of an inductive load, it should be recognized that the transient suppressor 20 may be used for other applications related to any such load driver circuitry.

While the invention has been illustrated and described in detail in the foregoing drawings and description, the same is to be considered as illustrative and not restrictive in character, it being understood that only the preferred embodiment has been shown and described and that all changes and modifications that come within the spirit of the invention are desired to be protected.

The embodiments of the invention in which an exclusive property or privilege is claimed are defined as follows:

1. An integrated circuit defining an inductive load snubbing device comprising:

a first region of N-type semiconductor material;

a second region of P-type semiconductor material arranged within said first region and forming a PN junction therebetween;

a number of third regions of N-type semiconductor material arranged within said second region, each of said third regions forming an independent PN junction with said second region; and a fourth region of P-type semiconductor material arranged within one of said third regions and forming a PN junction therebetween.

2. The integrated circuit of claim 1 wherein said first region is electrically connected to said fourth region to define an input to said inductive load snubbing circuit.

3. The integrated circuit of claim 2 wherein said number of third regions not having said fourth region arranged therein are electrically connected together to define an output of said inductive load snubbing circuit.

4. The integrated circuit of claim 3 wherein said first region and said number of third regions not having said fourth region arranged therein include an ohmic contact thereto.

5. The integrated circuit of claim 4 wherein each of said ohmic contacts are formed by arranging a fifth region of n+-type semiconductor material within a corresponding N-type region to establish a Nn+ junction therebetween.

6. The integrated circuit of claim 1 including two of said third regions, wherein the one of said third regions having said fourth region arranged therein is surrounded by the other of said third regions.

7. The integrated circuit of claim 1 further including a P-type semiconductor forming an integrated circuit substrate;

wherein said first region forms a PN junction with said substrate.

8. The integrated circuit of claim 7 further including a buried layer region of low resistivity N-type semiconductor material positioned between said substrate and said first region adjacent said second region; and a sixth region of low resistivity N-type semiconductor material having an ohmic contact thereto and extending into said buried layer region.

9. The integrated circuit of claim 1 wherein said integrated circuit is fabricated in accordance with a BICMOS process.

10. The integrated circuit of claim 1 wherein said fourth region, said third region having said fourth region arranged therein, said second region, and a remaining one of said third regions consecutively forms a silicon controlled rectifier (SCR);

and wherein the various regions of said SCR are doped sufficiently to render said SCR self-triggering.

* * * * *